United States Patent [19]
Lai et al.

[11] Patent Number: 6,136,680
[45] Date of Patent: Oct. 24, 2000

[54] METHODS TO IMPROVE COPPER-FLUORINATED SILICA GLASS INTERCONNECTS

[75] Inventors: Jane-Bai Lai, Fueng-Yuan; Chung-Shi Liu, Hsin-Chu; Tien-I Bao, Hsin-Chu; Syun-Ming Jang, Hsin-Chu; Chung-Long Chang, Dou-Liu; Hui-Ling Wang; Szu-An Wu, both of Hsin-Chu; Wen-Kung Cheng, Toufen; Chun-Ching Tsan, Toulin; Ying-Lang Wang, Tai-chung, all of Taiwan

[73] Assignee: Taiwan Semiconductor Manufacturing Company, Hsin-Chu, Taiwan

[21] Appl. No.: 09/489,498

[22] Filed: Jan. 21, 2000

[51] Int. Cl.⁷ .................. H01L 21/44; H01L 21/4763
[52] U.S. Cl. .................. 438/597; 438/618; 438/622; 438/624
[58] Field of Search .................. 438/597, 618, 438/622, 623, 631, 633, 687, 679, 700, 677

[56] References Cited

U.S. PATENT DOCUMENTS

| | | | |
|---|---|---|---|
| 5,395,796 | 3/1995 | Haskell et al. | 437/195 |
| 5,407,529 | 4/1995 | Homma | 156/643 |
| 5,420,069 | 5/1995 | Joshi et al. | 437/187 |
| 5,571,734 | 11/1996 | Tseng etal. | 437/40 |
| 5,759,906 | 6/1998 | Lou | 438/623 |
| 5,763,010 | 6/1998 | Guo et al. | 427/376.2 |
| 5,858,869 | 1/1999 | Chen et al. | 438/597 |
| 5,866,945 | 2/1999 | Chen et al. | 257/750 |
| 5,876,798 | 3/1999 | Vassiliev | 427/255.3 |
| 5,891,513 | 4/1999 | Dubin et al. | 427/98 |
| 6,010,962 | 1/2000 | Liu et al. | 438/667 |

OTHER PUBLICATIONS

Yang et al., "The Stability of Si–O–F low–k dielectrics: Attack by water molecules as function of near–neighbor Si–F bonding arrangements", J. Vacuum Sci. Technol., A 16(3), May/Jun. 1998, pp. 1525–1527.

Peters, "Pursuing the Perfect Low–k Dielectric", Semiconductor International, Sep. 1998, pp. 64–74.

Swope et al., "Improvement of Adhesion Properties of Fluorinated Silica Glass Films by Nitrous Oxide Plasma Treatment", Journal Electrochem. Soc., vol. 144, No. 7, Jul. 1997, pp. 2559–2564.

*Primary Examiner*—Amir Zarabian
*Assistant Examiner*—Michael S. Lebentritt
*Attorney, Agent, or Firm*—George O. Saile; Stephen B. Ackerman; Stephen G. Stanton

[57] ABSTRACT

A method of forming an interconnect, comprising the following steps. A semiconductor structure is provided that has an exposed first metal contact and a dielectric layer formed thereover. An FSG layer having a predetermined thickness is then formed over the dielectric layer. A trench, having a predetermined width, is formed within the FSG layer and the dielectric layer exposing the first metal contact. A barrier layer, having a predetermined thickness, may be formed over the FSG layer and lining the trench side walls and bottom. A metal, preferably copper, is then deposited on the barrier layer to form a copper layer, having a predetermined thickness, over said barrier layer covered FSG layer, filling the lined trench and blanket filling the barrier layer covered FSG layer. The copper layer, and the barrier layer on said upper surface of said FSG layer, are planarized, exposing the upper surface of the FSG layer and forming a planarized copper filled trench. The FSG layer and planarized copper filled trench are then processed by either: (1) annealing from about 400 to 450° C. for about one hour, then either $NH_3$ or $H_2$ plasma treating; or (2) $Ar^+$ sputtering to ion implant $Ar^+$ to a depth of less than about 300 Å in the fluorinated silica glass layer, whereby any formed Si—OH bonds and copper oxide (metal oxide) are removed. A dielectric cap layer, having a predetermined thickness, is then formed over the processed FSG layer and the planarized copper filled trench.

35 Claims, 4 Drawing Sheets

METHODS TO IMPROVE COPPER-FLUORINATED SILICA GLASS INTERCONNECTS

FIELD OF THE INVENTION

The present invention relates generally to the formation of metal interconnects in microminiaturized integrated circuits and more specifically to methods to improve metal, such as copper, interconnects in microminiaturized integrated circuits having fluorinated silica glass (FSG) low dielectric constant insulators in semiconductor devices and to methods to improve fluorinated silica glass (FSG)/silicon nitride (SiN) adhesion in copper Damascene process interconnects in microminiaturized integrated circuits having fluorinated silica glass (FSG) low dielectric constant insulators in semiconductor devices.

BACKGROUND OF THE INVENTION

Integrated circuit fabrication on semiconductor structures for ULSI (ultra large scale integration) require multilevels of metal interconnections for electrically interconnecting the discrete semiconductor devices on the semiconductor chips. Typically the insulating layers between the metal interconnections is silicon oxide ($SiO_2$) having a dielectric constant from about 4.1 to 4.5 (air having the lowest dielectric constant of 1.0). However as the device dimensions decrease, the spacing between the devices decrease to further miniaturization and the intra-level and inter-level capacitances (C) undesirably increase between the metal lines when using an insulating layer, e.g. $SiO_2$, having the same dielectric constant because the capacitance C is inversely proportional to the spacing between the metal lines (and is directly proportional to the dielectric constant k)

So insulating materials having lower dielectric constants k are needed to reduce the capacitance C, and thus reduce the RC (resistance×capacitance) time delay, so as to increase the performance of the circuit (frequency response) since the signal propagation time in the circuit is adversely affected by the RC time delay. One way to minimize RC time delays is, as noted above, using an insulating material having a lower dielectric constant k will also reduce RC time delays by decreasing capacitance C. One such inorganic low k material that is used is fluorine-doped silicon oxide, also known as fluorinated oxide or fluorine silicon glass (FSG). Also, using a good electrical conductor for the metal interconnections, such as using copper (Cu), instead of aluminum (Al) will reduce the resistance R. Once such a metal, e.g. Cu,—FSG metal interconnection structure is formed, the surface is covered by a dielectric cap, for example SiN.

Currently, chemical vapor deposition (CVD) of FSG is used for sub-quarter micron processes and chemical mechanical polishing (CMP) is the dominant process for copper (Cu) damascene. However, water in Cu CMP slurries, photo resist strip, or in subsequent cleaning solutions attack the surface of the FSG (Si—F bonds) forming undesired silanol (Si—OH) and affecting bonding between the SiN dielectric cap layer and the FSG resulting in peeling of dielectric layers. Bubbles are found at the FSG/SiN interface after SiN deposition 1 hour of 400° C. alloy.

Also, during the FSG integrated process, some H bond will exist in the FSG film (possibly from water or other film that diffused to the FSG film) which may react with unstable fluorine (F) in the FSG film to form HF which will attack the metal film to form FSG bubbles.

U.S. Pat. No. 5,759,906 to Lou describes an FSG intermetal dielectric layer and a method for fabricating a planar intermetal dielectric using a non-polish back technology to provide a planar multilevel metal structure. One embodiment uses low k materials, e.g. an FSG layer covering layers of FLARE™, to reduce the RC time delays for the interconnecting levels of metal.

U.S. Pat. No. 5,420,069 to Joshi et al. describes a $Cu/Cu_xGe_y$ alloy or $Cu/Cu_3Ge$ (copper/copper-germanium) phase bilayer interconnect metal lines layer to prevent electomigration and dissimilar metals like Al—Cu may be connected by $Cu_3Ge$ phase or $Cu_xGe_y$ alloy filled vias to improve electomigration performance. Corrosion resistant semiconductor devices and packaging interconnects where corrosion of copper interconnects are a problem are allowed by the $Cu/Cu_xGe_y$ alloy or $Cu/Cu_3Ge$ phase bilayer.

U.S. Pat. No. 5,891,513 to Dubin et al. describes a Cu interconnect with a Ta (tantalum) barrier layer and a SiN cap dielectric barrier layer and a method of utilizing electroless copper deposition to form interconnects on a semiconductor wafer.

U.S. Pat. No. 5,395,796 to Haskell et al. describes a silicon-oxyfluoride polymer and sputtering process for an intermetal dielectric (IMD) layer. An etch stop layer for permitting distinguishing between two similar layers, such as two oxide layers, during etching is provided. The etch stop layer comprises a silicon-oxyhalide polymer and permits closer placement of metal conductor surfaces.

U.S. Pat. No. 5,763,010 to Guo et al. describes a method of stabilizing a halogen-doped silicon oxide film to reduce halogen atoms migrating from the film during subsequent processing steps by subjecting the deposited halogen-doped silicon oxide film to a degassing step by briefly heating to a temperature between about 300 and 550° C. before deposition of a diffusion barrier layer. In the preferred embodiment the halogen-doped silicon oxide film is an FSG film that is degassed for between about 35 and 50 seconds.

The "Pursuing the Perfect Low-k Dielectric," Semiconductor International, September 1998, pp 64–74, article to Peters, discusses low-k dielectrics such as hydrogen silsequioxane (HSQ), fluorinated oxides (including FSG), silicon-based spin-on polymers, SiLK, FLARE, VELOX, BCB and organic and inorganic CVD films.

The "Improvement of Adhesion Properties of Fluorinated Silica Glass Films by Nitrous Oxide Plasma Treatment," J. Electrochem. Soc., Vol. 144, No. 7, July 1997, pp 2559–2564, article to Swope et al., describes the effects of nitrous oxide ($N_2O$) plasma surface treatment of FSG films in improving film stability an adhesion properties. Highly doped FSG films had to adhesion problems when the subsequent depositions occurred shortly after FSG deposition and plasma treatment, however all films blistered after being exposed to air for 2 days before passivation deposition. No evidence was developed that the moisture resistance of these FSG films was substantially improved by the $N_2O$ plasma treatment.

The "Stability of Si—O—F low-k dielectrics: Attack by water molecules as function of near-neighbor Si—F bonding arrangements," J. Vacuum Sci. Technol., A 16(3), May/June 1998, pp 1525–1527, article to Yang, et al. describes the stability of Si—O—F alloy films with respect to attack of Si—F bonds by water molecules. Their calculations show that the reaction:

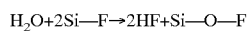

$$H_2O+2Si—F \rightarrow 2HF+Si—O—F$$

is exothermic by about 0.7 eV. The reaction energetics is a function of the distance between the F atoms of the Si—F groups and the H atoms of the H$_2$O molecule. Strong hydrogen bonding between H and F atoms is found. An upper limit for chemically stable F corporation has been determined to be about 10–12 at. % F, which corresponds to static dielectric constant of 3.2–3.4.

U.S. Pat. No. 5,858,869 to Chen et al. describes a method for making multilevel electrical interconnections having a planar intermetal dielectric (IMD) with low dielectric constant k and good thermal conductivity. Metal lines are formed on which anisotropic plasma oxide (APO) is deposited resulting in a thin oxide on the sidewalls of the metal lines and a much thicker oxide on top of the lines. The APO provides wider openings between metal lines filled with a low k dielectric polymer thereby reducing the RC (resistance×capacitance) time delay of the circuit. FSG is used to provide a lower dielectric constant k for further reducing the RC delay and a better thermal conductivity constant K for minimizing the Joule heating when the circuit is powered up.

U.S. Pat. No. 5,876,798 to Vassiliev describes films of fluorinated silicon oxide having no surface damage and good step coverage with no trapped voids, suitable for use as intermetal dielectrics, deposited in the first embodiment by means of chemical vapor deposition (CVD) at reduced pressure using fluorotriethoxysilane (FTES) and tetraexthyloxysilane (TEOS) as the precursors, together with ozone (mixed with oxygen). In a second embodiment, the TEOS is omitted and in a third embodiment a stacked layer is formed.

U.S. Pat. No. 5,407,529 to Homma describes a pattern formation method that used a tri-level resist structure with a fluorine contained SiO$_2$ intermediate film.

U.S. Pat. No. 5,866,945 to Chen et al. describes a spin-on hydrogen silsequioxane (HSQ) (replacing spun-on glass (SOG)) employed to gap fill metal layers in manufacturing a high density, multi-level layer semiconductor device. The degradation of deposited HSQ layers during formation of borderless vias is overcome by treating the degraded HSQ layer with an H$_2$ containing plasma to restore the Si—H bonds, thereby passivating the surface and preventing moisture absorption, before filling the via opening with conductive material, such a barrier layer.

U.S. Pat. No. 5,571,734 to Tseng et al. describes a method of fabricating a dielectric having an increased device current drive. A nitrogen-containing dielectric is formed then a fluorine-containing specie is introduced into a gate electrode overlying the nitrogen-containing dielectric. The fluorine is then driven up into the underlying nitrogen-containing dielectric. The interaction between the fluorine and nitrogen increases the overall current drive.

SUMMARY OF THE INVENTION

Accordingly, it is an object of the present invention to provide methods for improved bonding between SiN and FSG (fluorinated silicon glass).

Another object of the present invention is to provide an improved method of forming metal interconnects, such as copper, in microminiaturized integrated circuits having fluorinated silica glass (FSG) low dielectric constant insulators.

A further object of the present invention is to provide an improved method of forming metal interconnects, such as copper, in microminiaturized integrated circuits having fluorinated silica glass (FSG) low dielectric constant insulators by high temperature annealing.

Yet another object of the present invention is to provide an improved method of forming metal interconnects, such as copper, in microminiaturized integrated circuits having fluorinated silica glass (FSG) low dielectric constant insulators by argon (Ar) sputtering of the FSG surface.

Another object of the present invention is to provide methods for improved bonding between a dielectric cap, such as SiN, SiO, or SiON, and FSG (fluorinated silicon glass).

A further object of the present invention is to provide an improved method of forming metal interconnects, such as copper interconnects, in microminiaturized integrated circuits having fluorinated silica glass (FSG) low dielectric constant insulators.

A further object of the present invention is to provide an improved method of forming metal interconnects, such as copper interconnects, in microminiaturized integrated circuits having fluorinated silica glass (FSG) low dielectric constant insulators by a high density N$_2$ plasma treatment of the FSG surface.

Yet another object of the present invention is to provide an improved method of forming metal interconnects, such as copper interconnects, in microminiaturized integrated circuits having fluorinated silica glass (FSG) low dielectric constant insulators by an NH$_3$ plasma treatment of the FSG surface from about 200 to 1000° C.

A further object of the present invention is to provide an improved method of forming metal interconnects, such as copper interconnects, in microminiaturized integrated circuits having fluorinated silica glass (FSG) low dielectric constant insulators by an O$_2$ or N$_2$O plasma treatment of the FSG surface from about 350 to 450° C.

Another object of the present invention is to provide an improved method of forming metal interconnects, such as copper interconnects, in microminiaturized integrated circuits having fluorinated silica glass (FSG) low dielectric constant insulators by an in-situ N$_2$ plasma treatment of the FSG surface followed by deposition of a PEOX film.

Other objects will appear hereinafter.

It has now been discovered that the above and other objects of the present invention may be accomplished in the following manner. Specifically, in the first option of the present invention, a semiconductor structure is provided that has an exposed first metal contact. A dielectric layer having a predetermined thickness is formed over the semiconductor structure. A fluorinated silica glass layer having a predetermined thickness is then formed over the dielectric layer. A trench, having a predetermined width, is formed within the fluorinated silica glass layer and the dielectric layer exposing the first metal contact. A metal, preferably copper, is then deposited to form a copper layer, having a predetermined thickness over said fluorinated silica glass layer, filling the trench and blanket filling the fluorinated silica glass layer. The copper layer, which may include an underlying barrier layer, is planarized exposing the upper surface of the fluorinated silica glass layer and forming a planarized copper filled trench. The fluorinated silica glass layer and planarized metal filled trench are then processed by either (1) annealing from about 400 to 450° C. for about one hour, then either NH$_3$ or H$_2$ plasma treating; or (2) Ar sputtering to implant Ar to a depth of less than about 300 Å in the fluorinated silica glass layer whereby any formed Si—OH bonds and copper oxide (metal oxide) are removed. A dielectric cap layer, having a predetermined thickness, is then formed over the processed fluorinated silica glass layer and the planarized copper filled trench.

In the second option of the present invention, a cleaned, planarized metal filled trench in a layer of fluorinated silica glass on a semiconductor structure having an exposed metal contact is provided. The metal filled trench may be comprised of copper, silver, AlCu, gold, or platinum. A plasma treatment is then applied to the cleaned semiconductor structure. The plasma treatment may be a high density $N_2$ plasma treatment, a $NH_3$ plasma treatment at 200 to 1000° C., an oxygen ($O_2$) plasma treatment at about 400° C., or an nitrous oxide ($N_2O$) plasma treatment at about 400° C. A dielectric cap layer having a predetermined thickness is then formed over the plasma treated fluorinated silica glass layer and the planarized metal filled trench. The dielectric cap layer may be comprised of $Si_xN_y$, $SiO_x$, SiON, or $AlN_x$.

In the third option of the present invention, a cleaned, planarized metal filled trench in a layer of fluorinated silica glass on a semiconductor structure having an exposed metal contact is provided. The metal filled trench may be comprised of copper, silver, AlCu, gold, or platinum. An in-situ $N_2$ plasma treatment is then applied to the cleaned semiconductor structure with enough power to eliminate the H bond (HF) yet low enough not to form much N bond side effects. A PEOX film (dielectric cap layer) is then immediately deposited at a predetermined thickness over the plasma treated fluorinated silica glass layer and the planarized metal filled trench without breaking vacuum so no additional H will diffuse to the FSG film to form HF. The dielectric cap layer may be comprised of $Si_xN_y$, $SiO_x$, SiON, SiC, or $AlN_x$.

A key point of this invention is the recognition of the problem that the CMP process produces HF which will attack the metal and cause problems. Any treatments, such as thermal or plasma treatments, performed before the CMP are less effective in solving this HF problem.

BRIEF DESCRIPTION OF THE DRAWINGS

The features and advantages of the method of formation of metal and improved metal-FSG interconnects according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, processes etc. may be formed or accomplished by conventional methods known in the prior art.

Figure 1:
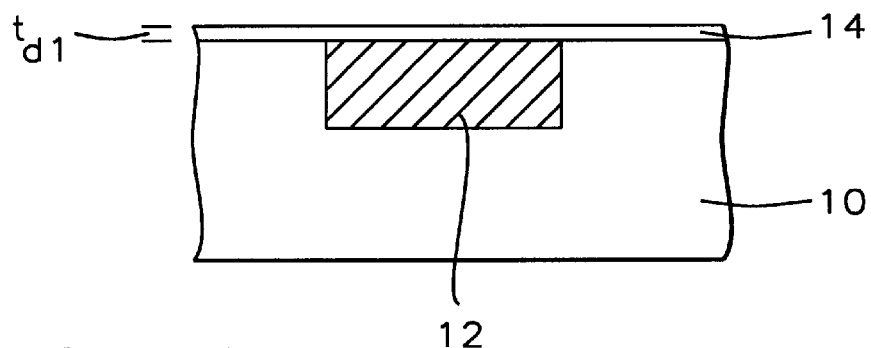
FIGS. 1 to 6 show a series of schematic cross-sectional diagrams illustrating the results of progressive stages in forming metal interconnects i n microminiaturized integrated circuits having fluorinated silica glass (FSG) low dielectric constant insulators in semiconductor devices, in accordance with the options of the present invention.

Accordingly as shown in FIG. 1, semiconductor structure 10, such as a single-crystal silicon on which are formed semiconductor devices. The devices are not shown in the Figures to simplify the drawings and the discussion. Semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

First metal contact 12 is exposed on the surface on semiconductor structure 10 and a dielectric layer 14, preferably SiN, is formed on semiconductor structure 10 by any conventional method. Dielectric layer 14 has a thickness $t_{dl}$ from about 300 to 1000 Å.

Figure 2:
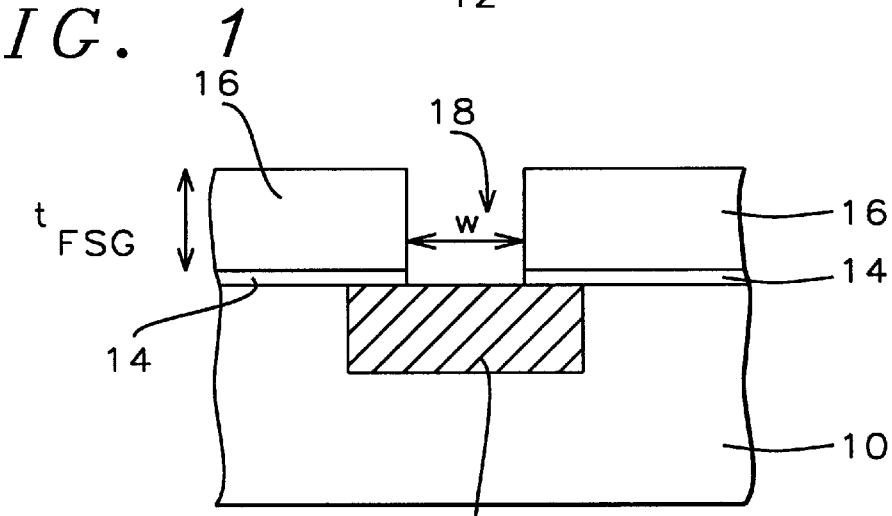

As shown in FIG. 2, fluorinated silicon glass (FSG) layer 16 is deposited over SiN layer 14 by PECVD at the following parameters: temperature range: from about 350 to 450° C.; flow rate: $SiF_4$ from about 28 to 36 and more preferably about 32 sccm, and $SiH_4$ from about 98 to 110 and more preferably about 104 sccm (these flow rates of $SiF_4$ and $SiH_4$ may be scaled to maintain the same molar ratios); time from about 1 to 10 minutes; tool/chamber(s) used: Novellus made by Applied Materials.

FSG layer 16 has a thickness $t_{FSG}$ from about 4000 to 20,000 Å. FSG layer 16 has from about 4 to 6% of fluorine (F). The CMP process employed makes the FSG formed more susceptible to $H_2O/O_2$ attack to form Si—OH bonds.

Trench 18, having side walls and a bottom, is formed within FSG layer 16 and SiN layer 14, exposing first metal contact 12, by any conventional method. Trench 18 has a width w from about 1000 to 6000 Å.

Figure 3:
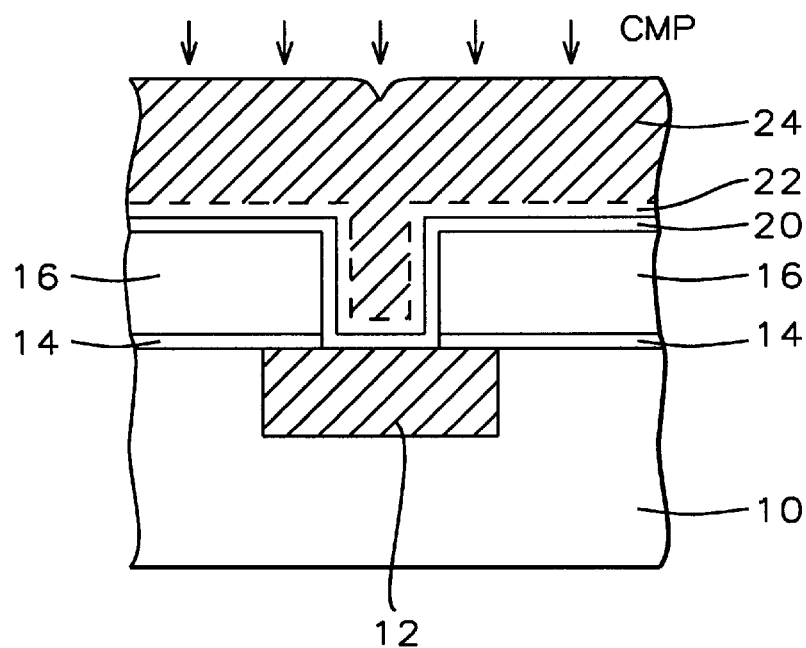

As shown in FIG. 3, barrier layer 20 may be formed over FSG layer 16 and within trench 18. Barrier layer 20 is preferably comprised of tantalum nitride (TaN) or tantalum (Ta) (for a subsequent copper (Cu) deposition) and is deposited over FSG dielectric layer 16 and in trench 18 preferably by an ionized metal plasma including Ta or TaN. Barrier layer 20 prevents spiking of subsequently deposited second metal layer 24 into FSG dielectric layer 16 and/or semiconductor structure 10 and increases adhesion of subsequently deposited second metal layer 24 to the underlying FSG dielectric layer 16 and/or semiconductor structure 10.

As is known in the prior art, an optional metal seed layer 22 (as shown in FIG. 3) may be used over barrier layer 20 by any conventional method.

Second metal layer 24 is then deposited over seed layer 22, blanket filling FSG dielectric layer 16, and filling trench 18 to form the structure of FIG. 3. Metal seed layer 22 and second metal layer 24 may be silver, AlCu, gold (Au) or platinum (Pt) and is preferably copper as will be used for illustration purposes hereinafter. Copper layer 24 is preferably electroplated by electro-chemical deposition (ECD).

Figure 4:
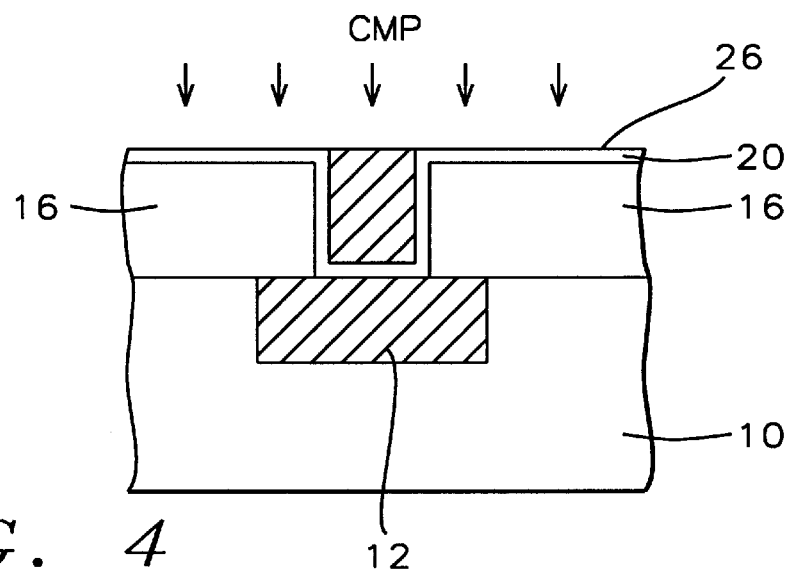

As shown in FIG. 4, Cu layer 24/Cu seed layer 22 are chemically mechanically polished (CMP) exposing TaN barrier layer 20 having planar surface 26.

Figure 5:
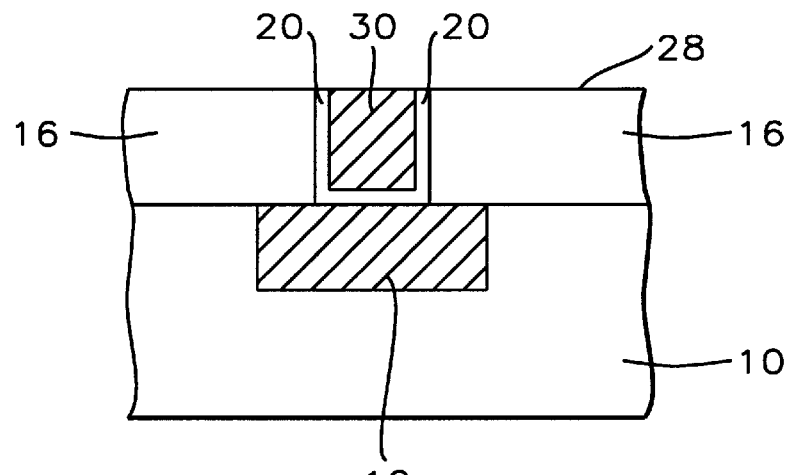

As shown in FIG. 5, exposed TaN barrier layer 20 is then removed by chemically mechanically polishing (CMP) to form planar Cu filled trench, or interconnect, 30 having planar surface 28. For example, a LAM Research CMP tool may be used with chemicals $Al_2O_3$, $H_2O_2$, and $C_2H_5O_2N$ at about 25° C.

Surface 28 is optionally polished, e.g. by an oxide polish, to remove any copper (or metal) oxidation that may have formed.

The wafer is then cleaned under the following parameters to provide a cleaned, planarized metal filled trench in a layer of fluorinated silica glass (FSG) on a semiconductor structure having an exposed metal contact.

After the CMP and/or cleaning, the surface of FSG dielectric layer 16 will include undesired Si—OH, or silanol, bonds if the wafer is exposed to air or $H_2O$, for example. If not removed, the silanol will cause blistering and peeling of subsequent layers, e.g. SiN. Bubbles are found at FSG/SiN interface after SiN deposition and a 1 hour 400° C. alloy. Further, the surface of FSG dielectric layer 16 may include undesired H bonds with unstable F from the FSG to form HF which will attack metal film to form FSG bubbles.

A key point of this invention is the recognition of the problem that the CMP process produces HF which will attack the metal and cause problems. Any treatments, such as thermal or plasma treatments, performed before the CMP are less effective in solving this HF problem.

The cleaned wafer may then be used as a starting point for either of the following three options.

OPTION 1

Option 1 includes one of two methods that have been discovered to remove such Si—OH bonds.

Option 1-A

The first method A of option 1 includes placing the cleaned wafer in a chamber purged with $N_2$ and $H_2$, then annealing the wafer in a furnace at from about 350 to 450° C. and more preferably from about 400 to 450° C. for about 0.5 to 2 hours and more preferably one (1) hour.

Any copper oxide is removed by a $NH_3$ or $H_2$ plasma treatment at the following conditions: at about 5 to 100 mTorr; from about 25 to 400° C.; with $NH_3$ at about 50 sccm or $H_2$ at about 10 sccm, respectively; and at about 200 W. This may occur in the same chamber, with the $NH_3$ plasma treatment preferred.

Figure 6:
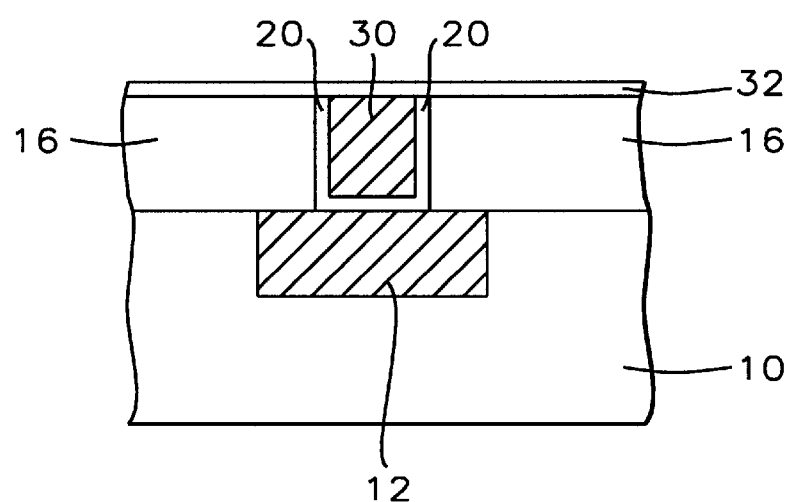
Figure 7:
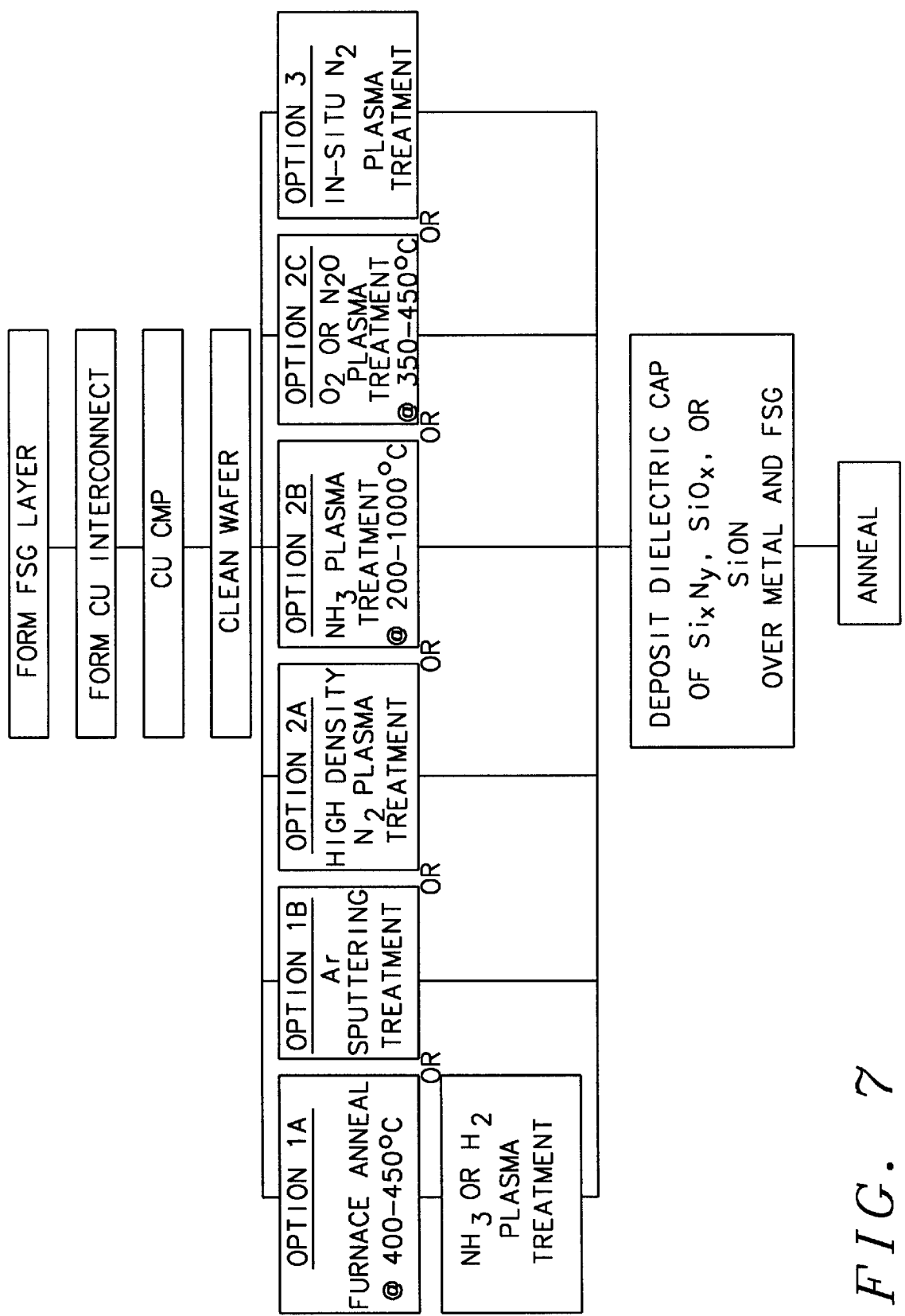
FIG. 7 is a flow chart diagram showing the steps of the three options of the present invention.

A dielectric layer, which may be SiON, $SiO_x$, or SiC and more preferably silicon nitride (SiN), is then deposited over FSG dielectric layer and Cu interconnect 30 surface 28 to form the structure shown in FIG. 6. A strong bond is therefore created between FSG dielectric layer 16 and Cu interconnect 30, and dielectric layer 32, e.g. SiN, that prevents blistering or peeling of the dielectric layers.

All three steps of Option 1-A (anneal, plasma treatment, and dielectric layer deposition) are preferably performed in-situ in the same chamber.

Option 1-B

In the second method B of option 1, the cleaned wafer is placed into a chamber where a shallow argon (Ar) sputter is conducted over surface 28 at a temperature from about 25 to 300° C. and more preferably from about 25 to 100° C. The Ar sputter is carried out under the following conditions: Ar at about 5 sccm at about 2 mTorr and 400 W RF; such that Ar is implanted into FSG dielectric layer 16 to a depth of less than about 50 to 300 Å and more preferably less than about 300 Å. This also eliminates, or minimizes any Si—OH bonds on the surface of FSG dielectric layer 16 and any copper oxide on the surface of Cu interconnect 30.

Silicon nitride (SiN), is then deposited over FSG dielectric layer and Cu interconnect 30 surface 28 to form the structure shown in FIG. 6. A strong bond is therefore created between FSG dielectric layer 16 and Cu interconnect 30, and dielectric layer 32, e.g. SiN, that prevents blistering or peeling of the dielectric layers.

All the steps of Option 1-B are preferably performed in-situ in the same chamber.

OPTION 2

Figure 8:
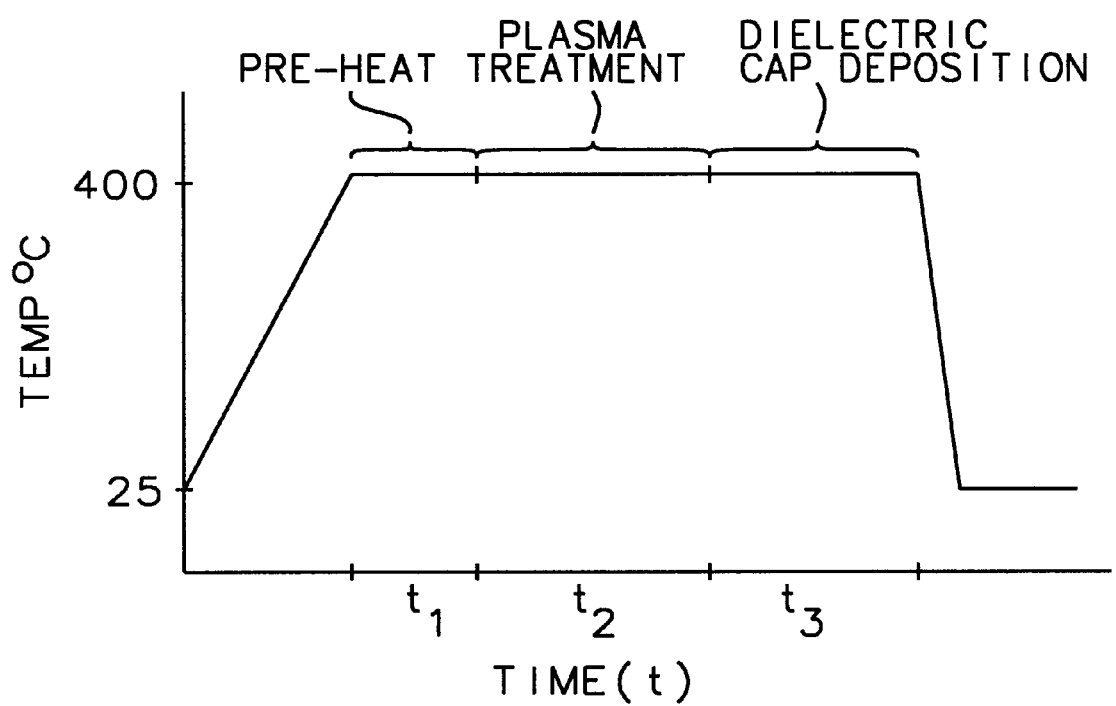
FIG. 8 is a graph of temperature versus time for the heating steps and cap deposition step of the second method B of the second option of the present invention.

Option 2 includes three plasma treatment methods that have been discovered to remove such Si—OH bonds and prepare the structure for deposition of a dielectric cap layer. See FIG. 8.

Option 2-A

The first method A of option 2 utilizes a high density $N_2$ plasma treatment for a time, from about 0.1 to 60 minutes, of the cleaned, planarized metal filled trench in a layer of FSG from about 100 to 600° C. for at the following additional parameters: gas: $N_2$, Ar and He; Pressure: from about $10^{-3}$ to 100 Torr; Power: from 0 to about 10,000 Watts; Flow: and from about 1 to 10,000 sccm. The high density nitrogen plasma treatment of the present invention is more efficient. It is theorized that Si—N bonds are formed on the surface of FSG layer 16, i.e. the FSG surface is slightly nitiridized.

All the steps of Option 2-A are preferably performed in-situ in the same chamber.

Option 2-B

The second method B of option 2 utilizes a $NH_3$ plasma treatment after a pre-heating from about 200 to 1000° C. for time $t_1$, from about 1 to 1000 seconds, more preferably from about 300 to 500° C. for about 20 to 120 seconds, and most preferably at about 400° C. for about 20 to 120 seconds. The $NH_3$ plasma treatment is conducted at the following parameters for a time $t_2$, from about 1 to 1000 seconds, gas: $N_2$, NH3; Pressure: from about $10^{-3}$ to 100 Torr; Power: from 0 to about 1000 Watts; Flow: from about 1 to 10,000 sccm; and using a PE-CVD reactor or an HDP-CVD reactor.

The pre-heating and $NH_3$ plasma treatment are used together to desorb moisture and slightly nitridize the FSG surface to improve FSG/dielectric cap layer (such as SiN) adhesion. FIG. 8A is a graph of temperature versus time for the three steps of method B of option 2. (See below for the third, dielectric cap deposition step)

All the steps of Option 2-B are preferably performed in-situ in the same chamber.

Option 2-C

The third method C of option 2 utilizes either an oxygen ($O_2$) or nitrous oxide ($N_2O$) plasma treatment at about 375 to 425° C., for time from about 1 to 1000 seconds at the following additional parameters: gas: $O_2$, $N_2O$, Ar, $N_2$; Pressure: from about $10^{-3}$ to 100 Torr; Power: from 1 to about 10,000 Watts; and Flow: from about 1 to 10,000 sccm.

Regardless of which method of option 2 is used to prepare the semiconductor structure, a dielectric layer cap 32, which may be comprised of $Si_xN_y$, $SiO_x$, SiON, or SiC and more preferably silicon nitride (SiN), is then deposited over FSG dielectric layer and Cu interconnect 30 surface 28 for a time $t_3$ to form a layer having a thickness from about 10 to 5000 Å, (See FIG. 8A for the second method B of option 2) to form the structure shown in FIG. 6.

A strong bond is therefore created between FSG dielectric layer 16 and metal interconnect 30, e.g. a Cu interconnect, and dielectric layer 32, e.g. a SiN layer, that prevents blistering or peeling of the dielectric layers.

All the steps of Option 2-C are preferably performed in-situ in the same chamber.

OPTION 3

Option 3 utilizes an in-situ $N_2$ plasma treatment for a time $t_{10}$, from about 1 to 1000 seconds, of the cleaned, planarized metal filled trench (which may be comprised of copper, silver, AlCu, gold, or platinum) in a layer of FSG. The in-situ $N_2$ plasma treatment is conducted at temperature from about 100 to 600° C. for about 1 to 1000 seconds at the following additional parameters: gas: $H_2$, Ar; Pressure: from about $10^{-3}$ to 1000 Torr; Power: from 1 to about 10,000 Watts; Flow: from about 1 to 10,000 sccm; and a PE-CVD reactor may be used.

The power of the $N_2$ plasma treatment must be high enough to eliminate any H bond (HF) yet low enough not to form many N bonds. After the in-situ $N_2$ plasma treatment, a PEOX film/dielectric cap layer 32 (which may be comprised of $Si_xN_y$, $SiO_x$, SiON, or $AlN_x$) is immediately deposited without breaking vacuum to form the structure shown in FIG. 6. By this method, no additional H will diffuse to FSG film 16 so there will be no FSG bubble defect at this interface.

All the steps of Option 3 are preferably performed in-situ in the same chamber.

While particular embodiments of the present invention have been illustrated and describe, it is not intended to limit the invention, except as defined by the following claims.

We claim:

1. A method of forming an interconnect, comprising the steps of:
   providing a semiconductor structure having an exposed first metal contact;
   forming a dielectric layer having a predetermined thickness over said semiconductor structure;
   forming a fluorinated silica glass layer having a predetermined thickness over said dielectric layer;
   forming a trench within said fluorinated silica glass layer and said dielectric layer exposing said first metal contact, said trench having a predetermined width;
   forming a second metal layer filling said trench and blanket filling said fluorinated silica glass layer, said second metal layer having a predetermined thickness over said fluorinated silica glass layer;
   planarizing said second metal layer on said upper surface of said fluorinated silica glass layer, exposing said upper surface of said fluorinated silica glass layer and forming a planarized second metal filled trench;
   processing said fluorinated silica glass layer and said planarized second metal filled trench whereby any formed Si—OH bonds and second metal oxide are removed; and
   forming a dielectric cap layer having a predetermined thickness over said processed fluorinated silica glass layer and said planarized second metal filled trench.

2. The method of claim 1, wherein said processing includes the steps of annealing said semiconductor structure at about 400 to 450° C. then reducing said second metal oxide by a plasma treatment, said plasma treatment selected from the group consisting of $NH_3$ plasma treatment and $H_2$ plasma treatment.

3. The method of claim 1, wherein said dielectric layer thickness is from about 300 to 1000 Å, said fluorinated silica glass layer thickness is from about 4000 to 20,000 Å, and said trench width is from about 1000 to 6000 Å.

4. The method of claim 1, wherein said dielectric cap layer is comprised of SiN.

5. The method of claim 1, wherein said second metal layer is selected from the group comprising copper, silver, AlCu, Au and Pt.

6. A method of forming an interconnect, comprising the steps of:
   providing a semiconductor structure having an exposed first metal contact;
   forming a dielectric layer having a predetermined thickness over said semiconductor structure;
   forming a fluorinated silica glass layer having a predetermined thickness over said dielectric layer;
   forming a trench within said fluorinated silica glass layer and said dielectric layer exposing said first metal contact, said trench having a predetermined width;
   forming a second metal layer filling said trench and blanket filling said fluorinated silica glass layer, said second metal layer having a predetermined thickness over said fluorinated silica glass layer;
   planarizing said second metal layer on said upper surface of said fluorinated silica glass layer, exposing said upper surface of said fluorinated silica glass layer and forming a planarized second metal filled trench;
   annealing said semiconductor structure at about 400 to 450° C. then reducing said second metal oxide by a plasma treatment, said plasma treatment selected from the group consisting of $NH_3$ plasma treatment and $H_2$ plasma treatment, whereby any formed Si—OH bonds and second metal oxide are removed; and
   forming a dielectric cap layer having a predetermined thickness over said fluorinated silica glass layer and said planarized second metal filled trench.

7. A method of forming an interconnect, comprising the steps of:
   providing a cleaned, planarized second metal interconnect in a layer of fluorinated silica glass on a semiconductor structure having an exposed first metal contact;
   annealing said semiconductor structure at about 400 to 450° C. for about one hour;
   plasma treating said annealed semiconductor structure, said plasma treatment selected from the group consisting of $NH_3$ plasma and $H_2$ plasma; and
   forming a dielectric cap layer having a predetermined thickness over said fluorinated silica glass layer and said planarized second metal filled trench.

8. The method of claim 7, wherein said dielectric cap layer is comprised of SiN.

9. The method of claim 7, wherein said fluorinated silica glass comprises from about 4 to 6% fluorine.

10. The method of claim 7, wherein said second metal layer is selected from the group comprising copper, silver, AlCu, Au and Pt.

11. A method of forming an interconnect, comprising the steps of:
    providing a cleaned, planarized second metal interconnect in a layer of fluorinated silica glass on a semiconductor structure having an exposed first metal contact;
    treating said semiconductor structure by argon sputtering ion implantation; and
    forming a dielectric cap layer having a predetermined thickness over said fluorinated silica glass layer and said planarized second metal filled trench.

12. The method of claim 11, wherein said dielectric cap layer is comprised of SiN and wherein said second metal layer is selected from the group comprising copper, silver, AlCu, Au and Pt.

13. The method of claim 11, wherein said fluorinated silica glass comprises from about 4 to 6% fluorine.

14. The method of claim 11, wherein said dielectric layer thickness is from about 300 to 1000 Å, said fluorinated silica glass layer thickness is from about 4000 to 20,000 Å, and said trench width is from about 1000 to 6000 Å.

15. The method of claim 11, wherein said argon ion implantation deposits argon ions to a depth of less than about 50 to 300 Å in said fluorinated silica glass layer.

16. The method of claim 11, wherein said argon ion implantation deposits argon ions to a depth of less than about 300 Å in said fluorinated silica glass layer.

17. A method of forming an interconnect, comprising the steps of:
providing a cleaned, planarized metal filled trench in a layer of fluorinated silica glass on a semiconductor structure having an exposed metal contact;
treating said semiconductor structure with high density nitrogen plasma; and
forming a dielectric cap layer having a predetermined thickness over said fluorinated silica glass layer and said planarized metal filled trench.

18. The method of claim 17, wherein said high density nitrogen plasma treatment is conducted at a temperature from about 100 to 400° C. for about 0.5 to 2 minutes.

19. The method of claim 17, wherein said dielectric cap layer is selected from the group comprising $Si_xN_y$, $SiO_x$, SiON, and SiC.

20. The method of claim 17, wherein said metal filled trench is comprised of a metal selected from the group comprising copper, silver, AlCu, Au and Pt.

21. A method of forming an interconnect, comprising the steps of:
providing a cleaned, planarized metal filled trench in a layer of fluorinated silica glass on a semiconductor structure having an exposed metal contact;
treating said semiconductor structure with an $NH_3$ plasma at a temperature from about 200 to 1000° C.; and
forming a dielectric cap layer having a predetermined thickness over said fluorinated silica glass layer and said planarized metal filled trench.

22. The method of claim 21, wherein said metal filled trench is comprised of a metal selected from the group comprising copper, silver, AlCu, Au and Pt.

23. The method of claim 21, wherein said $NH_3$ plasma treatment is conducted at a temperature from about 300 to 500° C. for about 10 to 60 seconds.

24. The method of claim 21, wherein said NH3 plasma treatment is conducted at about 400° C. for about 10 to 60 seconds.

25. The method of claim 21, wherein said dielectric cap layer is selected from the group comprising $Si_xN_y$, $SiO_x$, SiON, and SiC.

26. A method of forming an interconnect, comprising the steps of:
providing a cleaned, planarized metal filled trench in a layer of fluorinated silica glass on a semiconductor structure having an exposed metal contact;
treating said interconnect with an oxygen plasma at a temperature from about 300 to 500° C.; and
forming a dielectric cap layer having a predetermined thickness over said fluorinated silica glass layer and said planarized metal filled trench.

27. The method of claim 26, wherein said oxygen plasma treatment is conducted at a temperature from about 375 to 425° C. for about 1 to 1000 seconds and said dielectric cap layer is selected from the group comprising $Si_xN_y$, $SiO_x$, SiON, and SiC.

28. The method of claim 26, wherein said metal filled trench is comprised of a metal selected from the group comprising copper, silver, AlCu, Au and Pt.

29. A method of forming an interconnect, comprising the steps of:
providing a cleaned, planarized metal filled trench in a layer of fluorinated silica glass on a semiconductor structure having an exposed metal contact;
treating said interconnect with an $N_2O$ plasma at a temperature from about 300 to 500° C.; and
forming a dielectric cap layer having a predetermined thickness over said fluorinated silica glass layer and said planarized metal filled trench.

30. The method of claim 29, wherein said $N_2O$ plasma treatment is conducted at a temperature from about 375 to 425° C. for about 1 to 1000 seconds and said dielectric cap layer is selected from the group comprising $Si_xN_y$, $SiO_x$, SiON, and SiC.

31. The method of claim 29, wherein said metal filled trench is comprised of a metal selected from the group comprising copper, silver, AlCu, Au and Pt.

32. A method of forming an interconnect, comprising the steps of:
providing a cleaned, planarized metal filled trench in a layer of fluorinated silica glass on a semiconductor structure having an exposed metal contact;
treating said semiconductor structure with an in-situ nitrogen plasma under vacuum; and
then immediately forming a PEOX dielectric cap layer having a predetermined thickness over said fluorinated silica glass layer and said planarized metal filled trench while maintaining said vacuum.

33. The method of claim 32, wherein said in-situ nitrogen plasma treatment is conducted at a temperature from about 100 to 600° C. for about 1 to 1000 seconds.

34. The method of claim 32, wherein said dielectric cap layer is selected from the group comprising $Si_xN_y$, $SiO_x$, SiON, and SiC.

35. The method of claim 32, wherein said metal filled trench is comprised of a metal selected from the group comprising copper, silver, AlCu, Au and Pt.

* * * * *